(12) United States Patent
Ariyoshi et al.

(10) Patent No.: US 8,956,011 B2
(45) Date of Patent: Feb. 17, 2015

(54) BULB TYPE SEMICONDUCTOR LIGHT-EMITTING DEVICE LAMP

(75) Inventors: Tetsuo Ariyoshi, Suwon-si (KR); Cheon-ho Park, Suwon-si (KR); Byeong-hyeon Yu, Seoul (KR); Ji-hoon Yun, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 140 days.

(21) Appl. No.: 13/597,727

(22) Filed: Aug. 29, 2012

(65) Prior Publication Data

US 2013/0051013 A1 Feb. 28, 2013

(30) Foreign Application Priority Data

Aug. 29, 2011 (KR) ........................ 10-2011-0086558

(51) Int. Cl.
*F21V 29/00* (2006.01)
*F21V 3/00* (2006.01)
*F21K 99/00* (2010.01)
*F21Y 101/02* (2006.01)
*F21V 3/02* (2006.01)
*F21V 3/04* (2006.01)

(52) U.S. Cl.
CPC ............... *F21V 29/004* (2013.01); *F21K 9/135* (2013.01); *F21V 29/2206* (2013.01); *F21V 29/2212* (2013.01); *F21Y 2101/02* (2013.01); *F21K 9/00* (2013.01); *F21V 3/02* (2013.01); *F21V 3/0418* (2013.01); *F21V 3/0436* (2013.01); *F21V 3/0472* (2013.01)
USPC ........................ 362/249.02; 362/363; 362/294

(58) Field of Classification Search
CPC ....... F21Y 2101/02; F21K 9/13; F21K 9/135; F21V 29/004; F21V 29/2206; F21V 29/2212; F21V 3/005; F21V 17/12
USPC .............................. 362/249.02, 294, 373, 363
See application file for complete search history.

(56) References Cited

U.S. PATENT DOCUMENTS

| 6,409,361 | B1* | 6/2002 | Ikeda ............................. 362/240 |
| 8,414,160 | B2* | 4/2013 | Sun et al. ....................... 362/294 |
| 2009/0302730 | A1* | 12/2009 | Carroll et al. .................... 313/46 |
| 2011/0163683 | A1* | 7/2011 | Steele et al. ................... 315/192 |
| 2012/0112615 | A1* | 5/2012 | Kuenzler ........................ 313/46 |

FOREIGN PATENT DOCUMENTS

| JP | 2010-073337 A | 4/2010 |
| JP | 2010-073438 A | 4/2010 |
| KR | 10-2010-0037353 A | 4/2010 |

* cited by examiner

*Primary Examiner* — Peggy Neils
(74) *Attorney, Agent, or Firm* — Sughrue Mion, PLLC

(57) ABSTRACT

A bulb-type semiconductor light-emitting device lamp having wide light distribution characteristics which are similar to those of a typical incandescent bulb is provided. The semiconductor light-emitting device lamp includes: a plurality of light-emitting devices that are arranged such that light is emitted therefrom toward a central axis of the bulb-type semiconductor light-emitting device lamp. Also, the bulb-type semiconductor light-emitting device lamp includes a heat dissipation structure having a plurality of installation surfaces that surround the central axis and are separated from each other, wherein each of the plurality of light-emitting devices includes one or more light-emitting devices.

19 Claims, 11 Drawing Sheets

BULB TYPE SEMICONDUCTOR LIGHT-EMITTING DEVICE LAMP

CROSS-REFERENCE TO RELATED APPLICATION

This application claims priority from Korean Patent Application No. 10-2011-0086558, filed on Aug. 29, 2011 in the Korean Intellectual Property Office, the disclosure of which is incorporated herein in its entirety by reference.

BACKGROUND

1. Field

Apparatuses and methods consistent with exemplary embodiments relate to bulb-type semiconductor light-emitting device lamps having wide light distribution characteristics.

2. Description of the Related Art

A light-emitting diode (LED) is a semiconductor light-emitting device that converts electrical signals into light by using, for example, a compound semiconductor. A semiconductor light-emitting device, such as an LED, has a longer lifespan, uses a lower voltage, and requires lower consumption power than other existing light-emitting devices. Also, the semiconductor light-emitting device has excellent response speed and impact-resistant characteristics and can be manufactured to be small and lightweight. The semiconductor light-emitting device may generate different wavelengths of light according to the type and composition of a semiconductor, and thus, various colors of light can be used for various purposes. Recently, an illumination device using a high-brightness light-emitting chip has been replacing typical fluorescent lamps or incandescent lamps.

For example, an LED bulb includes a sow block, a heat dissipation structure, a driving circuit, a printed circuit board (PCB), an LED, and a cover. The cover may be generally formed of a semicircle-shaped glass or a plastic material, such as acryl or polycarbonate. Also, to prevent direct exposure of the LED located inside the bulb, a white diffusion coating may be formed on an inner surface of the glass cover when the glass cover is used, and a diffusion material may be mixed with a cover material to embody a light diffusion effect when the plastic cover is used.

However, illumination lamps using a semiconductor light-emitting device have light distribution characteristics which are very different from those of typical incandescent bulbs, because such illumination lamps emits light that progresses only toward a forward direction, not in a direction covering all 360 angle degrees. For example, an LED bulb emits the highest intensity of light at an angle of 0°, and as the angle increases, the intensity of light is reduced. For example, at an angle of about ±90°, the intensity of light is almost 0. On the other hand, a typical incandescent bulb emits a constant intensity of light in an angle range from 0° to about ±130° without a decrease in the light intensity. Accordingly, a full width at half maximum (FWHM) of an irradiation angle of an LED bulb is about 130°, and an FWHM of an irradiation angle of a typical incandescent bulb is about 260°, which is substantially different from that of the LED bulb. This difference is due to the fact that while a filament used in a typical incandescent bulb emits light in a direction covering all 360 angle degrees, an LED irradiates light at an angle of about 120°. Thus, when an LED bulb is used in existing illumination devices, a user may recognize very different light distribution and illumination characteristics from those that the user is accustomed to. This may function as an obstacle to the supply and popularity of the LED bulb.

SUMMARY

One or more exemplary embodiments provide bulb-type semiconductor light-emitting device lamps having wide light distribution characteristics.

According to an aspect of an exemplary embodiment, there is provided a bulb-type semiconductor light-emitting device lamp including: a plurality of light-emitting devices arranged such that light is emitted therefrom toward a central axis of the bulb-type semiconductor light-emitting device lamp.

The bulb-type semiconductor light-emitting device lamp may further include a heat dissipation structure having a plurality of installation surfaces that surround the central axis and are separated from each other, and the plurality of light-emitting devices may include one or more light-emitting devices that are arranged on each of the installation surfaces along the central axis.

The installation surfaces may be rotationally symmetric about the central axis, and the number of the installation surfaces may be an odd number of 3 or more.

The installation surfaces may not face each other with respect to the central axis.

The installation surfaces may be arranged at different intervals, and in this case, the number of light-emitting devices mounted on each of the installation surfaces may vary.

The installation surfaces may extend in a direction parallel to the central axis, or the installation surfaces may be inclined at an angle with respect to the central axis.

The heat dissipation structure may include: a main body; a plurality of installation portions that each have the installation surface and an exposed surface opposite to the installation surface, wherein ends of the installation portions are connected to each other to form a summit of a bulb shape; and a connection portion that connects the main body and the installation portions.

The exposed surfaces may be curved surfaces that constitute a portion of the bulb shape.

A cover member may be disposed between adjacent installation portions and may encapsulate an inner space in which the light-emitting devices are disposed together with the installation portions.

The cover member may be formed of a material that diffuses light emitted from the light-emitting devices.

A high-reflection coating may be formed on at least one of a surface of the main body, a surface of the connection portion, and a surface of the installation portion which constitute an inner wall of the inner space, and for example, the high-reflection coating may be a high-reflection white coating including at least one of a foam PET-based material, a high-reflection white polypropylene, and a white polycarbonate resin.

A heat dissipation pattern may be formed on the exposed surfaces.

The main body may have a heat dissipation pattern, or the main body may include a plurality of heat dissipation fins.

According to an aspect of another exemplary embodiment, there is provided a bulb-type semiconductor light-emitting device lamp including: a first light-emitting device arranged on a first region of an interior surface of the bulb-type semiconductor light-emitting device lamp and which emits light toward a second region of the interior surface; and a second light-emitting device arranged on a third region of the interior surface at a rotational distance, with respect to a central axis of the bulb-type semiconductor light-emitting device lamp, from the first light-emitting device and which emits light toward a fourth region of the interior surface.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION OF EXEMPLARY EMBODIMENTS

Figure 1:
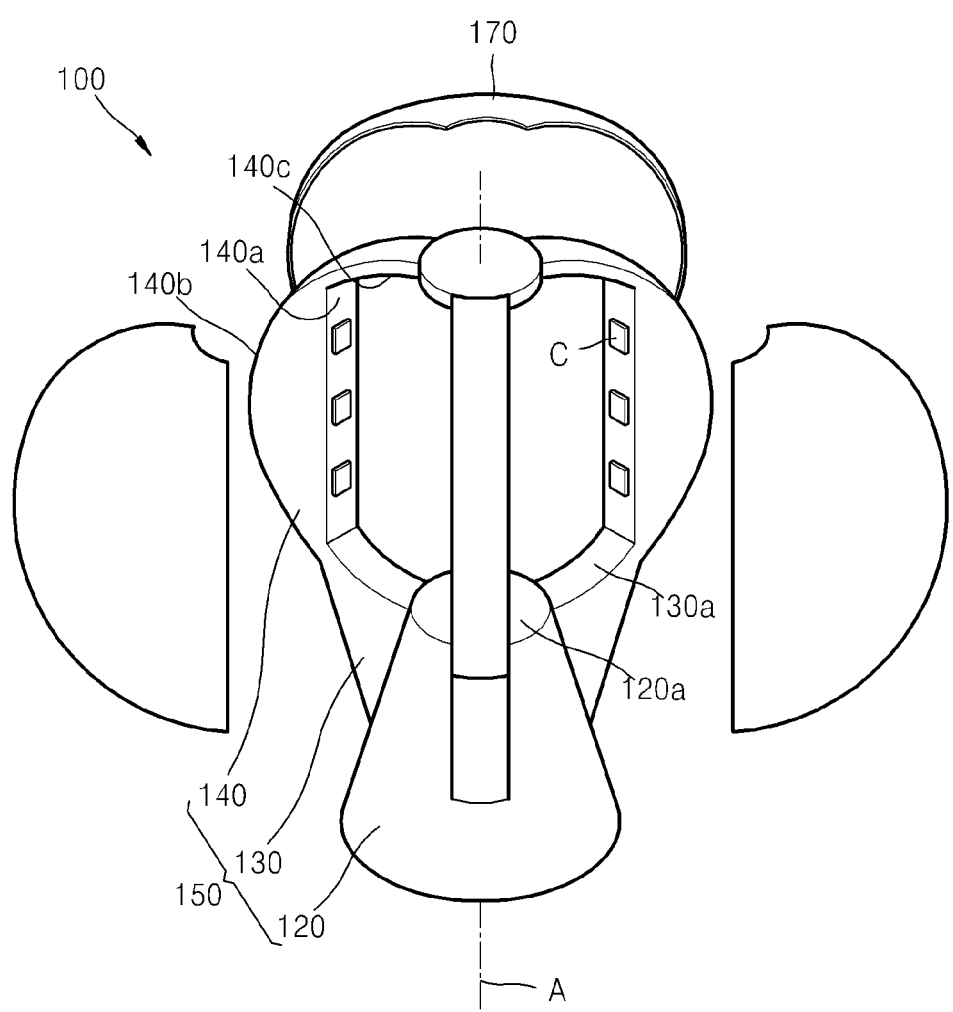
FIG. 1 is an exploded schematic perspective view of a bulb-type semiconductor light-emitting device lamp according to an exemplary embodiment.

Reference will now be made in detail to exemplary embodiments, examples of which are illustrated in the accompanying drawings, wherein like reference numerals refer to like elements throughout, and sizes of the respective elements may be enlarged for clarity. In this regard, exemplary embodiments may have different forms and should not be construed as being limited to the descriptions set forth herein. Accordingly, exemplary embodiments are merely described below, by referring to the figures, to explain aspects of the present description. Expressions such as "at least one of," when preceding a list of elements, modify the entire list of elements and do not modify the individual elements of the list.

Figure 2:
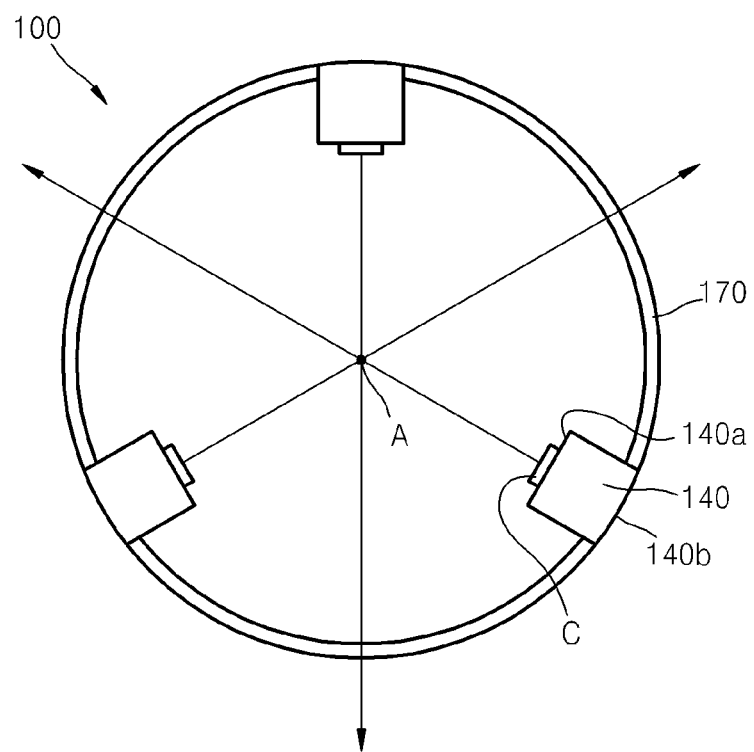
FIG. 2 is a front cross-sectional view of the bulb-type semiconductor light-emitting device lamp of FIG. 1.

FIG. 1 is an exploded schematic perspective view of a bulb-type semiconductor light-emitting device lamp 100 according to an exemplary embodiment. FIG. 2 is a front cross-sectional view of the bulb-type semiconductor light-emitting device lamp 100 of FIG. 1. FIGS. 3-6 illustrate exemplary structures of a light-emitting device C employed in the bulb-type semiconductor light-emitting device lamp 100 of FIG. 1.

The bulb-type semiconductor light-emitting device lamp 100 according to the present exemplary embodiment includes a plurality of light-emitting devices C that are disposed to allow light to be emitted toward a central axis of a bulb. The configuration of the light-emitting devices C enables a wider light distribution and, also, a shorter dissipation pathway of heat generated by the light-emitting devices C. In particular, the bulb-type semiconductor light-emitting device lamp 100 includes a heat dissipation structure 150 that includes a plurality of installation surfaces 140a that surround a central axis (A) of the bulb-type semiconductor light-emitting device lamp 100 and are separately disposed, wherein one or more light-emitting devices C are disposed on each of the installation surfaces 140a along the central axis (A). The installation surfaces 140a may be disposed rotationally symmetric about the central axis (A), though it is understood that the locations of the installation surfaces are not limited thereto in one or more other exemplary embodiments. Furthermore, it is understood that the light-emitting devices in one or more other exemplary embodiments may emit light toward an opposing surface of the bulb-type semiconductor light-emitting device lamp 100 without traversing the central axis (A) or without centrally traversing the central axis (A).

A detailed structure of the bulb-type semiconductor light-emitting device lamp 100 will now be described below.

The heat dissipation structure 150 includes a main body 120, an installation portion 140 on which the light-emitting devices C are mounted, and a connection portion 130 that connects the main body 120 to the installation portion 140.

The main body 120 may be connected to a socket connected to an external power source so as to supply power to the light-emitting devices 100, and the main body 120 may include an additional circuit element for other illumination modules. For example, the additional circuit element may be a zener diode that is a semiconductor device for preventing the light-emitting devices C from being damaged by static electricity, a thermistor that is a semiconductor device for controlling temperature, or the like. The main body 120 may have a conical shape having a wider bottom portion, though it is understood that one or more exemplary embodiments are not limited thereto. For example, the main body 120 may have a cylindrical shape or a conical shape having a narrower bottom portion.

A high-reflection coating may be formed or provided on a surface 120a of the main body 120, a surface 130a of the connection portion 130, or a surface 140c of the installation portion 140, that is, surfaces that form an inner wall of the bulb-type semiconductor light-emitting device lamp 100, so as to improve luminous efficiency. For example, the high-reflection coating may be formed on the surfaces by using a foam poly ethylene terephthalate (PET)-based material, such as microcellular poly ethylene terephthalate (MCPET), a high-reflection white polypropylene, a white polycarbonate (PC) resin, or the like.

The installation portion 140 includes the installation surfaces 140a and exposed surfaces 140b that are opposite to the installation surfaces 140a. As illustrated in FIG. 1, a plurality of installation portions 140 may be provided, and ends of the installation portions 140 may be connected to form a summit of the bulb shape. The exposed surfaces 140b may be, as illustrated, curved surfaces that constitute a portion of the bulb shape. However, the shape of the exposed surfaces 140b is not limited thereto in one or more other exemplary embodiments.

The heat dissipation structure 150 may be formed of metal with excellent thermal conductivity to allow heat generated by the light-emitting devices C to be effectively dissipated. For example, the heat dissipation structure 150 may be formed of a metal with excellent thermal conductivity, such as aluminum (Al) or copper (Cu), though it is understood that one or more other exemplary embodiments are not limited thereto. For example, the heat dissipation structure 150 may be formed of a resin material with excellent thermal conductivity.

Each of the light-emitting devices C may be mounted on a circuit substrate S (see FIGS. 3-6) and the resultant structure may be mounted on the installation surface 140a. On each of the installation surfaces 140a, one or more light-emitting devices C may be disposed. In the present exemplary embodiment illustrated in FIG. 1, three light-emitting devices C are disposed on each of the installation surfaces 140a. However, it is understood that one or more other exemplary embodiments are not limited thereto, and more or less than three light-emitting devices C may be disposed on each of the installation surfaces 140a. The light-emitting device C includes a semiconductor active layer that emits light by combination of an electron and a hole resulting from the appliance of voltage. A detailed structure of the light-emitting device C is described in detail below with reference to FIGS. 3 to 6.

Figure 3:
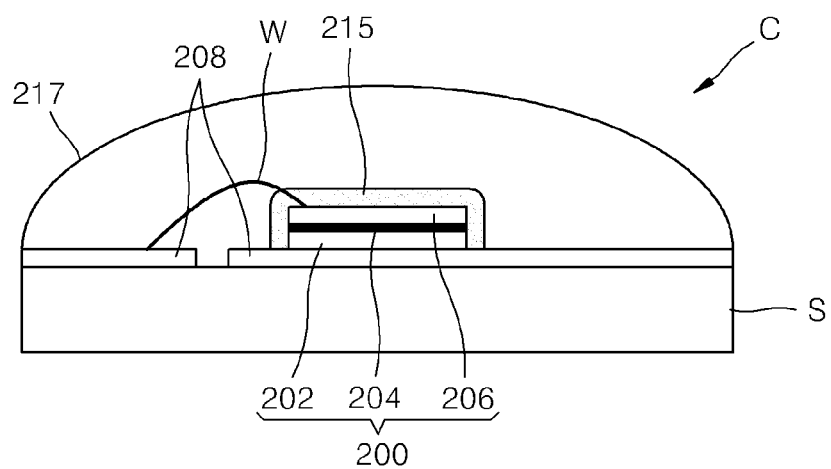
FIGS. 3-6 illustrate exemplary structures of a light-emitting device employed in the bulb-type semiconductor light-emitting device lamp of FIG. 1, according to various exemplary embodiments.

Referring to FIG. 3, the light-emitting device C includes a light-emitting chip 200 including a first semiconductor layer 202, an active layer 204, and a second semiconductor layer 206 which are disposed on a substrate S, and the light-emitting chip 200 is surrounded by a fluorescent layer 215. The substrate S may be a resin substrate, for example, a FR4 or FR5 substrate, or may be formed of ceramic or glass fiber. The first semiconductor layer 202, the active layer 204, and the second semiconductor layer 206 may be formed of or include compound semiconductors. For example, the first semiconductor layer 202 and the second semiconductor layer 206 may have a nitride semiconductor composition, that is, $Al_xIn_yGa_{(1-x-y)}N$ ($0 \leq x \leq 1$, $0 \leq y \leq 1$, and $0 \leq x+y \leq 1$), and may be doped with an n-type impurity and a p-type impurity, respectively. The active layer 204 formed (i.e., provided) between the first and second semiconductor layers 202 and 206 may emit a predetermined energy intensity of light by recombination of an electron and a hole, and may include a plurality of layers each having a composition represented by $In_xGa_{1-x}N$ ($0 \leq x \leq 1$) to control a band gap energy according to an indium content. In this case, the active layer 204 may have an alternately stacked structure of a quantum barrier layer and a quantum well layer, for example, a multiple quantum well (MQW) structure, such as an InGaN/GaN structure, and the indium content thereof may be controlled to emit blue light.

The fluorescent layer 215 may include at least one of a phosphor that absorbs blue light and excites red light and a phosphor that absorbs blue light and excites green light. Examples of a phosphor that excites red light are a nitride-based phosphor represented by $MAlSiNx:Re(1 \leq x \leq 5)$ and a sulfide-based phosphor represented by MD:Re. In this regard, M may be at least one selected from Ba, Sr, Ca, and Mg, D may be at least one selected from S, Se, and Te, and Re may be at least one selected from Eu, Y, La, Ce, Nd, Pm, Sm, Gd, Tb, Dy, Ho, Er, Tm, Yb, Lu, F, Cl, Br, and I. Also, examples of a phosphor that excites green light are a silicate-based phosphor represented by $M_2SiO_4:Re$, a sulfide-based phosphor represented by $MA_2D_4:Re$, a phosphor represented by β-SiAlON:Re, and an oxide-based phosphor represented by $MA'_2O_4:Re'$, wherein M may be at least one selected from Ba, Sr, Ca, and Mg, A may be at least one selected from Ga, Al, and In, D may be at least one selected from S, Se, and Te, A' may be at least one selected from Sc, Y, Gd, La, Lu, Al, and In, Re may be at least one selected from Eu, Y, La, Ce, Nd, Pm, Sm, Gd, Tb, Dy, Ho, Er, Tm, Yb, Lu, F, Cl, Br, and I, and Re' may be at least one selected from Ce, Nd, Pm, Sm, Tb, Dy, Ho, Er, Tm, Yb, F, Cl, Br and I.

From among blue light emitted from the active layer 204, some of the blue light may be converted into red light and some of the blue light may be converted into green light. Accordingly, blue light, red light, and green light are mixed to emit white light.

An electrode pattern portion 208 having two separated regions is formed on the substrate S. The electrode pattern portion 208 may be formed by plating using a conductive material, for example, Cu, Pd, Ag, Ni/Au, or the like. The first semiconductor layer 202 contacts a region of the electrode pattern portion 208 and the second semiconductor layer 206 is bonded to the other region of the electrode pattern portion 208 through a wire W.

Also, a cover layer 217 may further be formed to protect the light-emitting chip and control an orientation of light emitted from the light-emitting chip. The cover layer 217 may be formed of a transparent material, such as a resin. The shape of the cover layer 217 is not limited to the shape illustrated in FIG. 3. According to another exemplary embodiment, the cover layer 217 may have a flat shape, and in this case, the cover layer 217 does not function as a lens while protecting the light-emitting chip.

Figure 4:
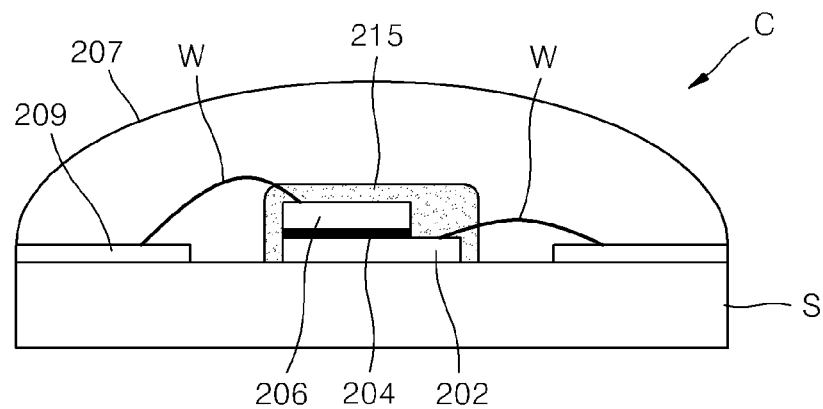

A light-emitting device C of FIG. 4 is different from the light-emitting device C of FIG. 3, in the structure of an electrode. That is, referring to FIG. 4, the light-emitting chip including the first semiconductor layer 202, the active layer 204, and the second semiconductor layer 206 has a structure that is etched in a mesa shape to expose a portion of the first semiconductor layer 202. The exposed portion of the first semiconductor layer 202 is bonded to a region of an electrode pattern portion 209 and the second semiconductor layer 206 is bonded to the other region of the electrode pattern portion 209, through wires (W).

Figure 5:
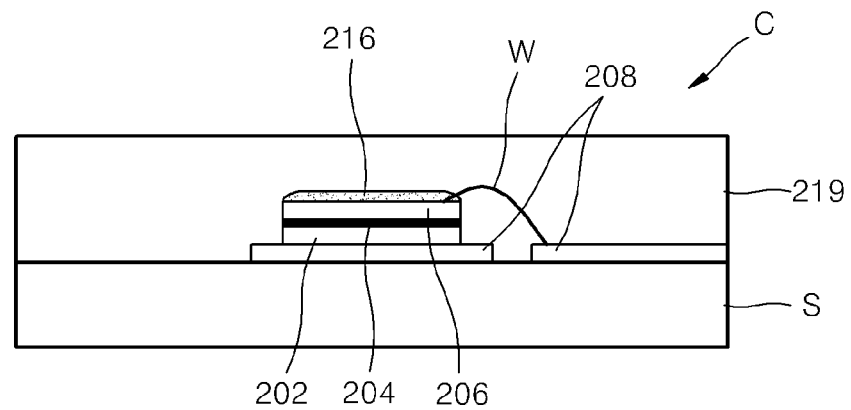

Regarding a light-emitting device C of FIG. 5, a fluorescent layer 216 is coated on an upper end of the light-emitting chip, and is not coated to surround the side ends of the light-emitting chip. Although the illustrated shape of a cover layer 219 in FIG. 5 is a flat shape, it is understood that one or more other exemplary embodiments are not limited thereto. For example, according to another exemplary embodiment, the cover layer 219 may have a lens shape to control an orientation of light emitted from the light-emitting chip.

Figure 6:
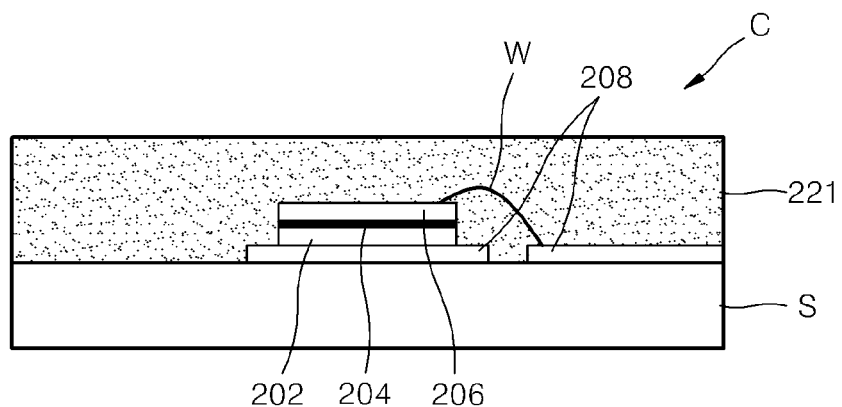

A light-emitting device C of FIG. 6 is different from the light-emitting device C of FIG. 5 in that, instead of the fluorescent layer formed on the upper end of the light-emitting chip, a cover layer 221 is formed of a transparent material mixed with a phosphor, for example, a resin material mixed with a phosphor. Though the cover layer 221 of FIG. 6 has a flat shape, it is understood that the cover layer 221 according to another exemplary embodiment may instead have a lens shape to control an orientation of light emitted from the light-emitting chip.

Hereinbefore, the light-emitting devices C exemplarily described with reference to FIGS. 5 and 6 are each disposed in a package on the substrate S and are wire-bonded to an electrode pattern formed on the substrate S. Also, according to a detailed shape of an electron pattern portion formed on the substrate S, adjacent light-emitting devices C may be connected in series, in parallel, or in a combination thereof. Also, although the light-emitting devices C include a fluorescent layer to emit white light, it is understood that one or more other exemplary embodiments are not limited thereto. For example, according to another exemplary embodiment, the fluorescent layer 215 and 216 may not be included, and thus, a particular color of light formed in an active layer may be directly emitted.

Referring back to FIG. 1, a cover member 170 is disposed between the installation portions 140. The cover member 170 may encapsulate an inner space of the bulb-type semiconductor light-emitting device lamp 100 together with the installation portions 140 to protect the light-emitting devices C. As a material for forming the cover member 170, a transparent plastic or glass based on poly carbonate (PC), poly methyl methacrylate (PMMA), or acrylic may be used. Also, the cover member 170 may be formed of a material that may diffuse light emitted from the light-emitting devices C, for example, a diffusion resin prepared by mixing a polycarbonate resin or an acryl resin with a diffusion material, or glass having a surface coated with a paint material for diffusing white light. Also, the cover member 170 may be further coated with a fluorescent material that effects color change of light emitted from the light-emitting device C. The cover member 170 may have a shape that includes a portion of the bulb shape.

Referring to FIG. 2, the light-emitting devices C may be disposed so as to not face each other, that is, so as to not face each other with respect to the central axis (A), and light emitted from the light-emitting devices C may be emitted toward the central axis A of the bulb-type semiconductor light-emitting device lamp 100 and then emitted toward the outside through the cover member 170. The exposed surface 140b that is opposite to the installation surface 140a is exposed to the outside, thereby enabling dissipation of heat generated by the light-emitting devices C through the exposed surface 140b. Also, due to the short heat dissipation pathway, heat may be efficiently dissipated.

Figure 7:
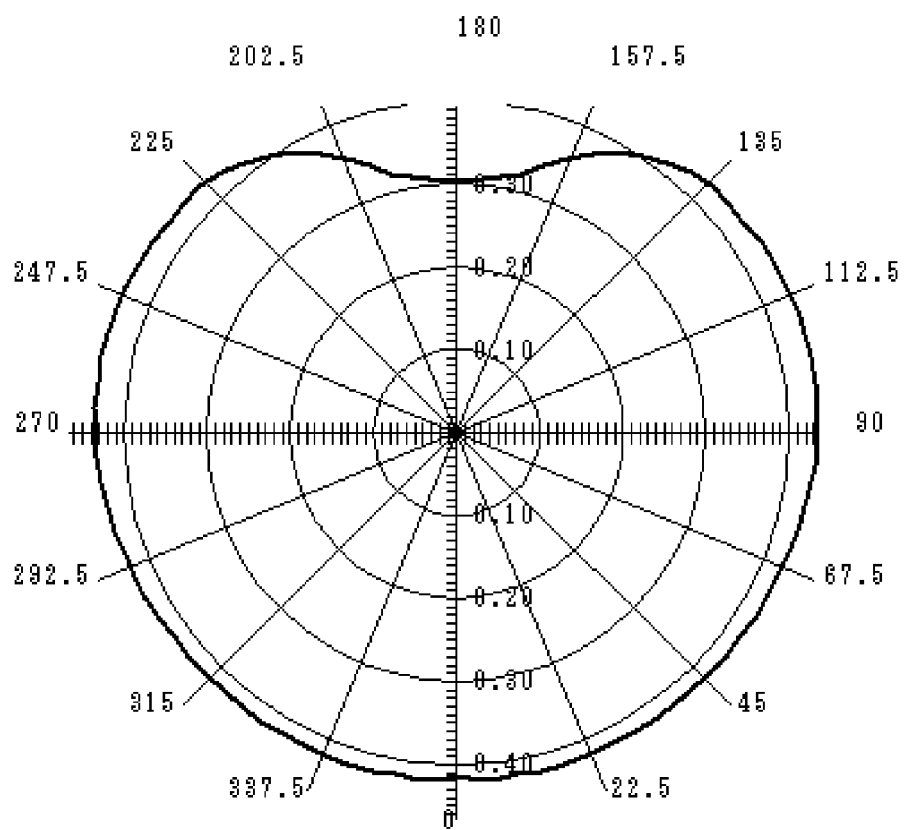
FIG. 7 illustrates a light distribution of the bulb-type semiconductor light-emitting device lamp of FIG. 1.

FIG. 7 is a computer simulation graph showing light distribution of the bulb-type semiconductor light-emitting device lamp 100 of FIG. 1. Referring to FIG. 7, light is uniformly irradiated in a direction covering almost all 360 angle degrees, which is comparable to that of a typical incandescent bulb.

Figure 8:
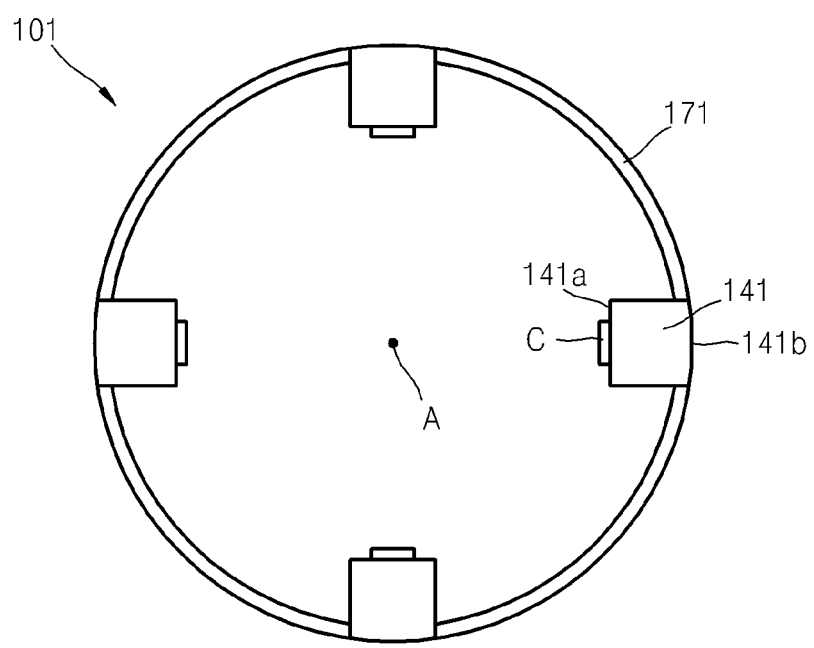
FIG. 8 is a schematic front cross-sectional view of a bulb-type semiconductor light-emitting device lamp according to another exemplary embodiment.

FIG. 8 is a schematic front cross-sectional view of a bulb-type semiconductor light-emitting device lamp 101 according to another embodiment of the present invention. The bulb-type semiconductor light-emitting device lamp 101 according to the present exemplary embodiment is different from that of FIG. 1, in the arrangement of an installation portion 141 of a heat dissipation structure, that is, the number of installation surfaces 141a, the configuration of light-emitting devices C according to the number of installation surfaces 141a, and the number of cover members 171. The number of installation surfaces 141a is four and the installation surfaces 141a are rotationally symmetric about each other at an angle of 90° such that the light-emitting devices C face each other according to the present exemplary embodiment. Furthermore, according to the present exemplary embodiment, the number of cover members 171 is four. It is understood, however, that the number of installation surfaces 141a are the number of cover members 171 are not limited to four in one or more other exemplary embodiments, and may instead be a different even number, such as, 2, 6, or 8.

Figure 9:
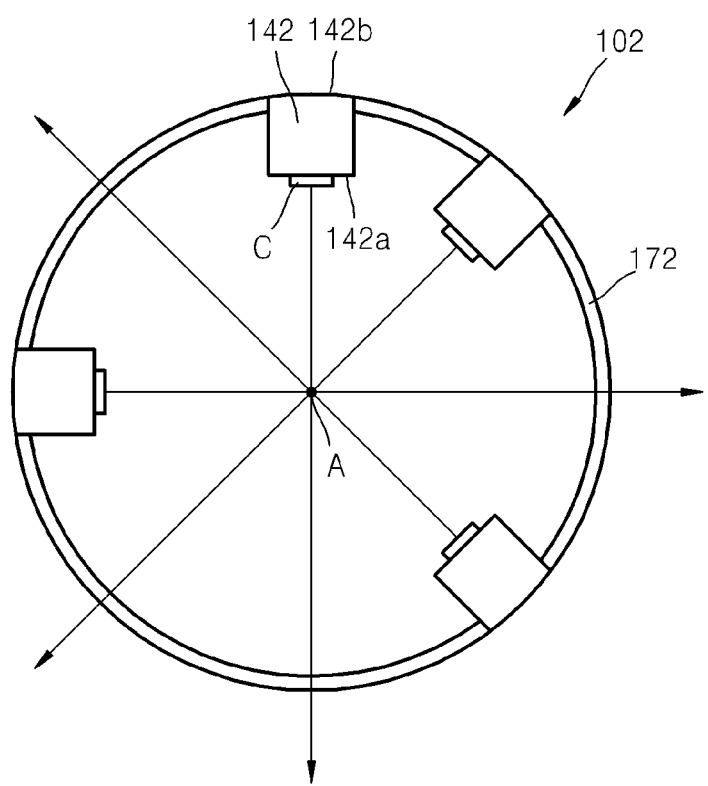
FIG. 9 is a schematic front cross-sectional view of a bulb-type semiconductor light-emitting device lamp according to another exemplary embodiment.

FIG. 9 is a schematic front cross-sectional view of a bulb-type semiconductor light-emitting device lamp 102 according to another exemplary embodiment. The bulb-type semiconductor light-emitting device lamp 102 according to the present exemplary embodiment is different from the bulb-type semiconductor light-emitting device lamp 101 of FIG. 8, in that the installation surfaces 142a do not face each other, although the number of installation surfaces 142a is the same as that of the bulb-type semiconductor light-emitting device lamp 101 of FIG. 8. That is, the installation portions 140 are disposed at different angle intervals with respect to the central axis A, and thus, the cover members 172 also have different sizes. Due to this configuration of the installation portions 140, light-emitting devices C do not face each other, and thus, light emitted from light-emitting devices C is efficiently dissipated toward the outside. In this case, to obtain a uniform light distribution, the number of light-emitting devices C disposed on each of the installation surfaces 142a may vary.

Figure 10:
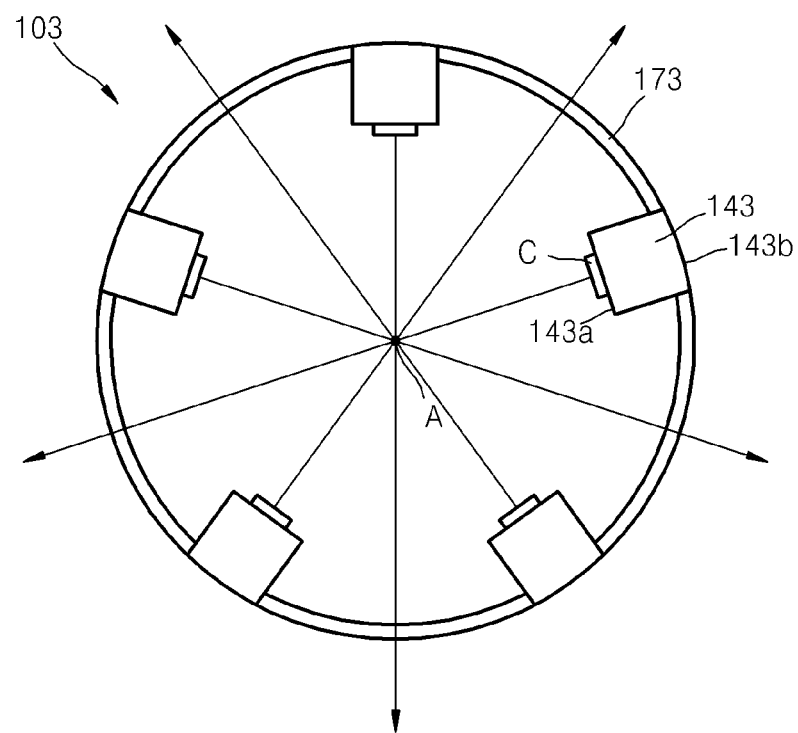
FIG. 10 is a schematic front cross-sectional view of a bulb-type semiconductor light-emitting device lamp according to another exemplary embodiment.

FIG. 10 is a schematic front cross-sectional view of a bulb-type semiconductor light-emitting device lamp 103 according to another exemplary embodiment. The bulb-type semiconductor light-emitting device lamp 103 according to the present exemplary embodiment includes installation surfaces 143a which are rotationally symmetric about the central axis A at an angle interval of 72°. That is, five installation portions 143 are disposed at the same intervals with respect to the central axis A, and corresponding five cover members 173 have the same sizes. However, it is understood that one or more other exemplary embodiments are not limited to five installation portions 143. For example, according to another exemplary embodiment, the number of the installation portions 143 may instead be an odd number other than five.

Figure 11:
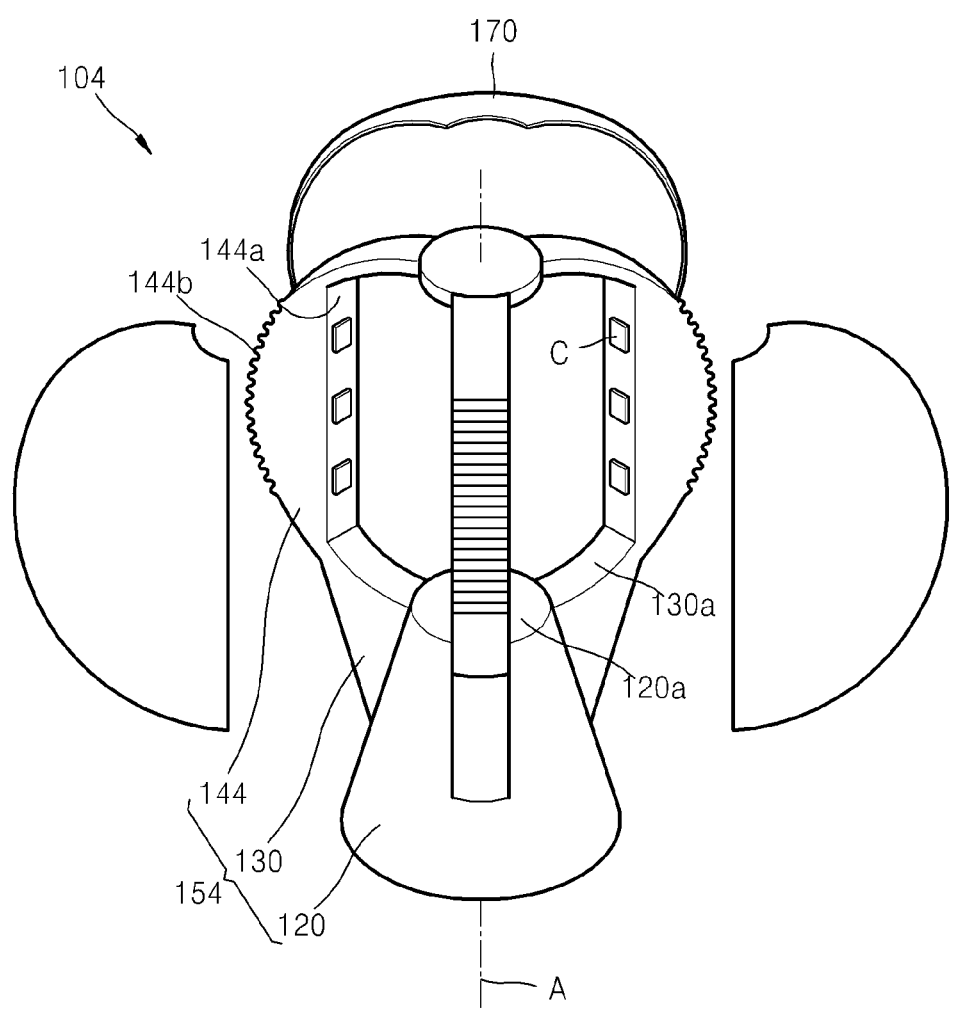
FIG. 11 is an exploded schematic perspective view of a bulb-type semiconductor light-emitting device lamp according to another exemplary embodiment.

FIG. 11 is an exploded schematic perspective view of a bulb-type semiconductor light-emitting device lamp 104 according to another exemplary embodiment. The bulb-type semiconductor light-emitting device lamp 104 according to the present exemplary embodiment is different from those of above-described exemplary embodiments in that a heat dissipation pattern is formed on an exposed surface 144b of an installation portion 144. The heat dissipation pattern may have, for example, an uneven pattern to increase a surface area to effectively dissipate heat. Also, although not illustrated, the main body 120 may also have an uneven pattern. Other detailed characteristics of the heat dissipation structure 154, for example, the number or configuration of installation portions 144 may vary as illustrated in FIGS. 8 to 10.

Figure 12:
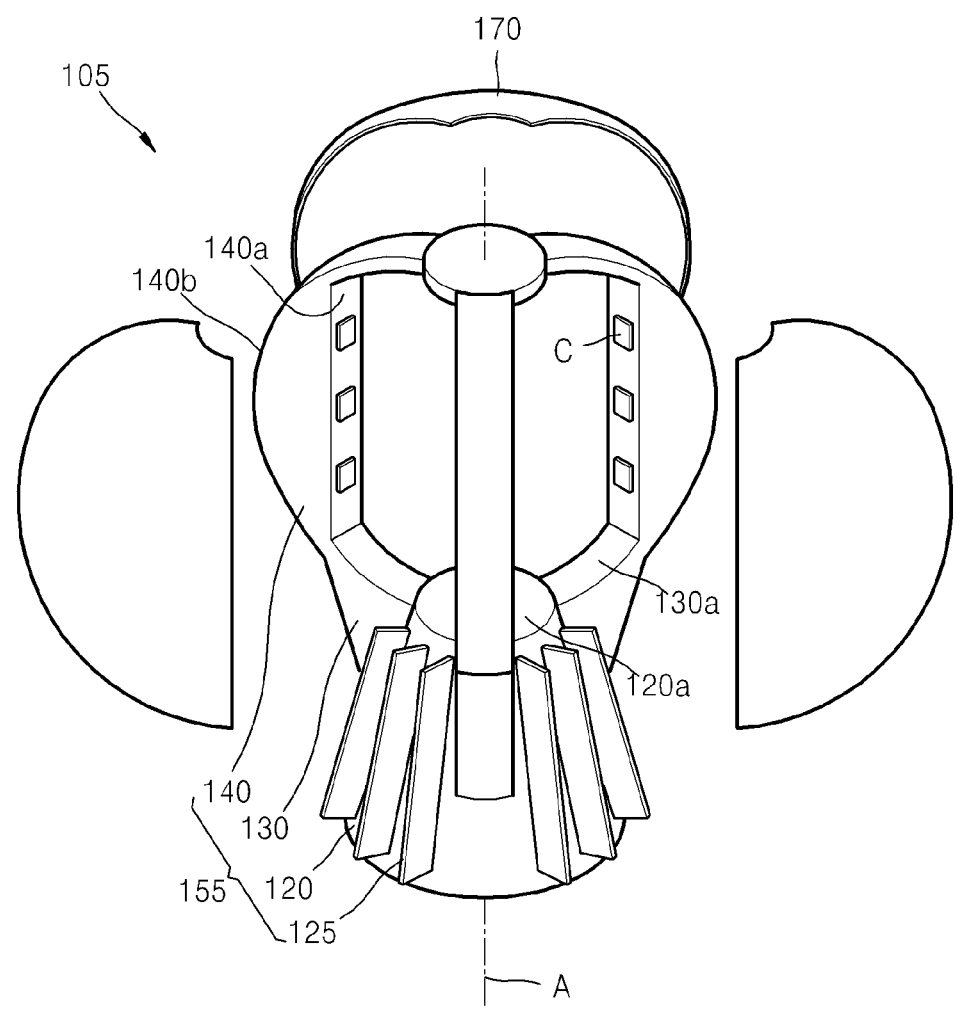
FIG. 12 is an exploded schematic perspective view of a bulb-type semiconductor light-emitting device lamp according to another exemplary embodiment.

FIG. 12 is an exploded schematic perspective view of a bulb-type semiconductor light-emitting device lamp 105 according to another exemplary embodiment. The bulb-type semiconductor light-emitting device lamp 105 according the present exemplary embodiment includes a heat dissipation fin 125 formed on the main body 120. The heat dissipation fin 125 also contributes to an increase in a surface area to effectively dissipate heat. Other detailed characteristics of a heat dissipation structure 155, for example, the number or configuration of installation surfaces 140a, may vary as illustrated in FIGS. 8 to 10. Also, the installation surface 140a may have an uneven pattern as illustrated in FIG. 11.

Figure 13:
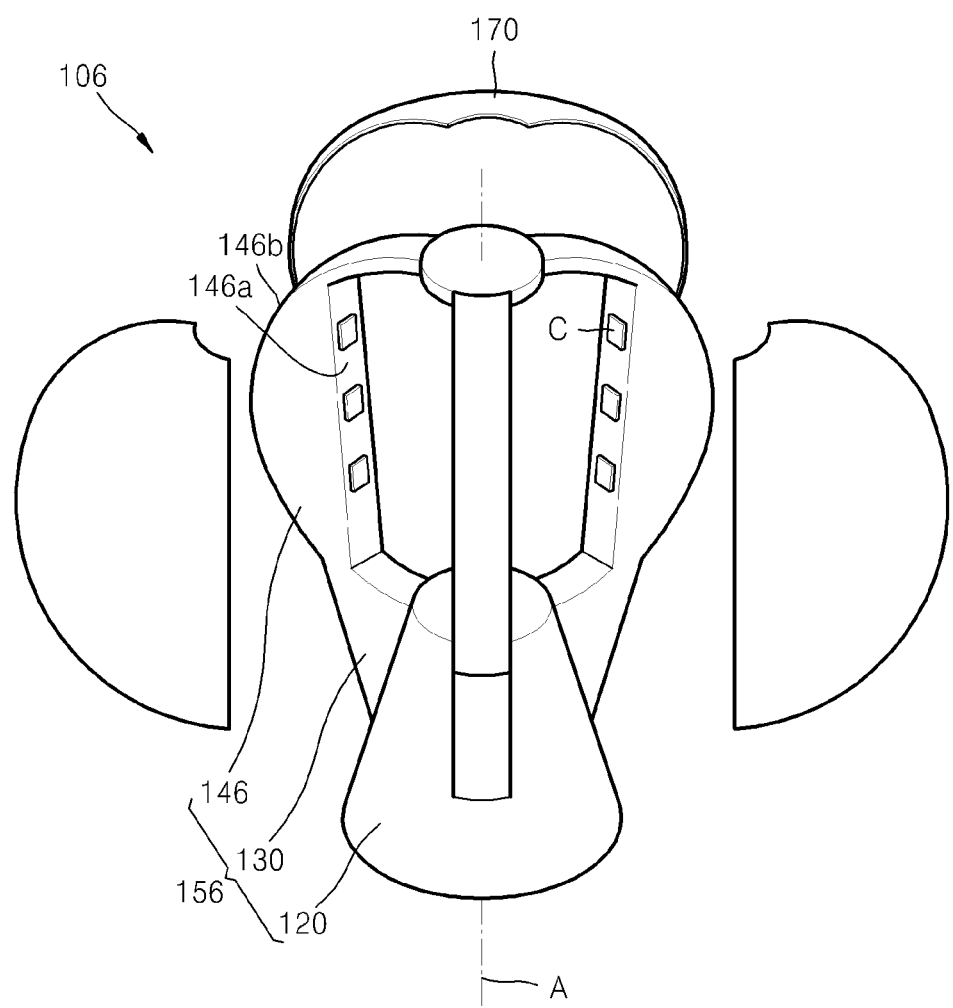
FIG. 13 is an exploded schematic perspective view of a bulb-type semiconductor light-emitting device lamp according to another exemplary embodiment.

FIG. 13 is an exploded schematic perspective view of a bulb-type semiconductor light-emitting device lamp 106 according to another exemplary embodiment. The bulb-type semiconductor light-emitting device lamp 106 according to the present exemplary embodiment is different from those of above-described exemplary embodiments in that an installation surface 146a is not parallel to the central axis A and is inclined at a predetermined angle. The inclined angle of the installation surface 146a may be appropriately determined to control a light distribution in a particular direction, and the illustrated shape may allow more light to be emitted upward of the bulb-type semiconductor light-emitting device lamp 106. Other detailed characteristics of a heat dissipation structure 156, for example, the number or configuration of installation surfaces 146a, may vary as illustrated in FIGS. 8 to 10. Also, the exposed surface 146b may further have an uneven pattern as illustrated in FIG. 11, and the main body 120 may further include the heat dissipation fin 125 illustrated in FIG. 12.

Figure 14:
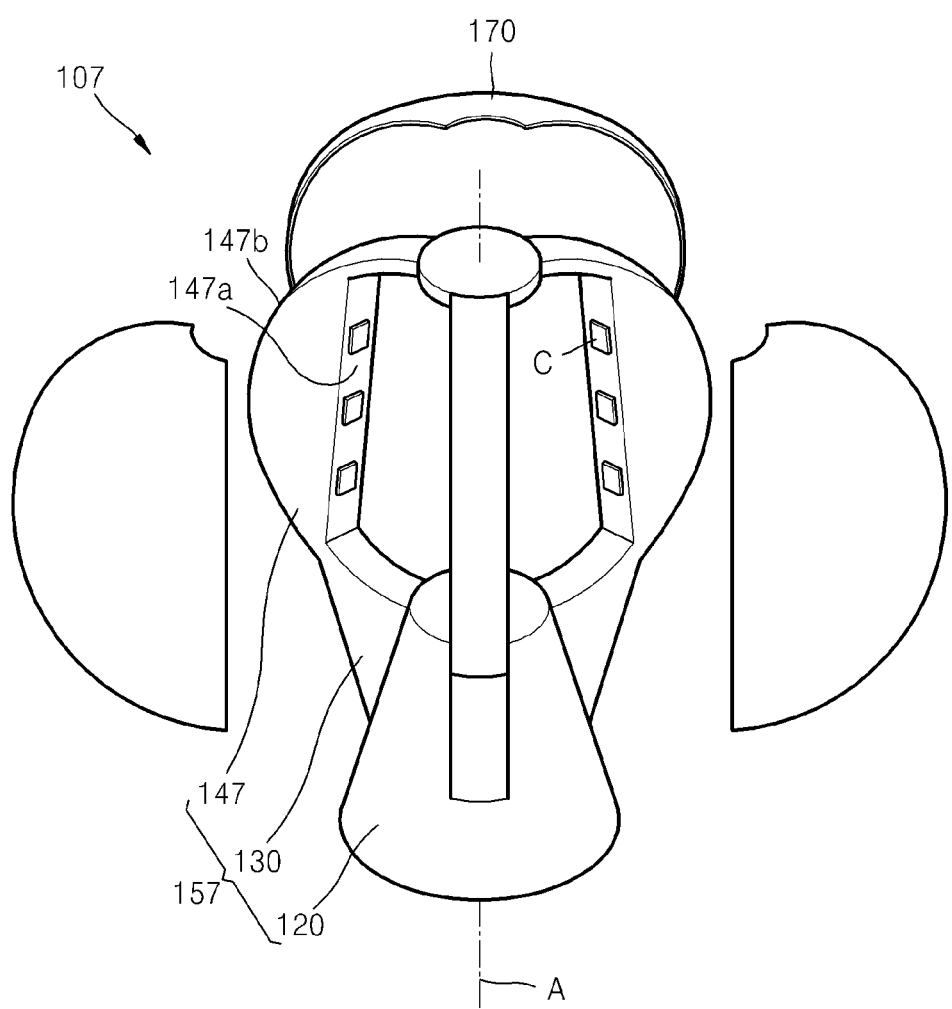
FIG. 14 is an exploded schematic perspective view of a bulb-type semiconductor light-emitting device lamp according to another exemplary embodiment.

FIG. 14 is an exploded schematic perspective view of a bulb-type semiconductor light-emitting device lamp 107 according to another exemplary embodiment. The bulb-type semiconductor light-emitting device lamp 107 according to the present exemplary embodiment is different from the bulb-type semiconductor light-emitting device lamp 106 of FIG. 13, in that an installation surface 147a is inclined toward the central axis A and the inclined surface faces downward. The illustrated shape may allow more light to be emitted downward of the bulb. Furthermore, other detailed characteristics of a heat dissipation structure 156, for example, the number or configuration of installation surfaces 147a, may vary as illustrated in FIGS. 8 to 10. Also, an exposed surface 147b may further have an uneven pattern as illustrated in FIG. 11, and the main body 120 may further have an uneven pattern or may further include the heat dissipation fins 125 illustrated in FIG. 12.

The disclosed bulb-type semiconductor light-emitting device lamps according to exemplary embodiments employ a semiconductor light-emitting device to provide environmentally friendly and low power consumptive illumination devices. Furthermore, the disclosed bulb-type semiconductor light-emitting device lamps provide a light distribution that is substantially equivalent to that of a typical incandescent bulb, that is, a light distribution that is uniform in a direction covering 360 angle degrees.

Also, the bulb-type semiconductor light-emitting device lamps may allow heat generated from a plurality of light-emitting devices to be effectively dissipated toward the outside.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

What is claimed is:

1. A bulb-type semiconductor light-emitting device lamp comprising:
   a plurality of installation portions;
   a plurality of light-emitting devices that are arranged on the plurality of installation portions to emit light toward a central axis of the bulb-type semiconductor light-emitting device lamp; and
   a plurality of cover members disposed between the plurality of installation portions, wherein the plurality of installation portions and the plurality of cover members form a bulb shape of the lamp and encapsulate the plurality of light-emitting devices.

2. The bulb-type semiconductor light-emitting device lamp of claim 1, further comprising:
   a heat dissipation structure comprising the plurality of installation portions, wherein the plurality of installation portions surround the central axis and are separated from each other,
   wherein the plurality of installation portions comprise a plurality of installation surfaces on which one or more light-emitting devices of the plurality of light-emitting devices are arranged along the central axis.

3. The bulb-type semiconductor light-emitting device lamp of claim 2, wherein the plurality of installation surfaces are rotationally symmetric about the central axis.

4. The bulb-type semiconductor light-emitting device lamp of claim 3, wherein a number of the plurality of installation surfaces is an odd number of 3 or more.

5. The bulb-type semiconductor light-emitting device lamp of claim 2, wherein the plurality of installation surfaces do not face each other with respect to the central axis.

6. The bulb-type semiconductor light-emitting device lamp of claim 2, wherein the plurality of installation surfaces are arranged at different intervals with respect to the central axis.

7. The bulb-type semiconductor light-emitting device lamp of claim 2, wherein the plurality of installation surfaces extend in a direction parallel to the central axis.

8. The bulb-type semiconductor light-emitting device lamp of claim 2, wherein the plurality of installation surfaces are inclined at an angle with respect to the central axis.

9. The bulb-type semiconductor light-emitting device lamp of claim 2, wherein the heat dissipation structure further comprises:
   a main body; and
   a connection portion which connects the main body and the plurality of installation portions,
   wherein the plurality of installation portions further comprise exposed surfaces opposite to the plurality of installation surfaces and exposed to an outside of the bulb-type semiconductor light-emitting device lamp, and ends of the plurality of installation portions are connected to each other to form a summit of the bulb shape.

10. The bulb-type semiconductor light-emitting device lamp of claim 9, wherein the exposed surfaces are curved surfaces that constitute a portion of the bulb shape.

11. The bulb-type semiconductor light-emitting device lamp of claim 9, wherein the plurality of cover members are disposed between adjacent installation portions of the plurality of installation portions, and encapsulate an inner space in which the plurality of light-emitting devices are disposed together with the plurality of installation portions.

12. The bulb-type semiconductor light-emitting device lamp of claim 9, wherein the exposed surfaces comprise a heat dissipation pattern which dissipates heat.

13. The bulb-type semiconductor light-emitting device lamp of claim 9, wherein the main body has a heat dissipation pattern which dissipates heat.

14. The bulb-type semiconductor light-emitting device lamp of claim 9, wherein the main body comprises a plurality of heat dissipation fins which dissipate heat.

15. The bulb-type semiconductor light-emitting device lamp of claim 2, wherein a first installation surface, of the plurality of installation surfaces, faces a second installation surface, of the plurality of installation surfaces, with respect to the central axis of the bulb-type semiconductor light-emitting device lamp.

16. The bulb-type semiconductor light-emitting device lamp of claim 9, further comprising a high-reflection coating on at least one of a surface of the main body, surfaces of the plurality of connection portions, and a surface of the installation portion.

17. A bulb-type semiconductor light-emitting device lamp comprising:
   a first installation portion comprising a first installation surface provided in a first region of an interior surface of the bulb-type semiconductor light-emitting device lamp;
   a first light-emitting device mounted on the first installation surface and configured to emit light toward a second region of the interior surface;

a second installation portion comprising a second installation surface provided in a third region of the interior surface;

a second light-emitting device mounted on the second installation surface and configured to emit light toward a fourth region of the interior surface, and a cover member disposed between the first and second installation portions, wherein the first and second installation portions and the cover member form a bulb shape of the lamp and encapsulate the first and second light-emitting devices.

18. The bulb-type semiconductor light-emitting device lamp of claim 17, further comprising:

a heat dissipation structure comprising the plurality of installation portions, wherein the plurality of installation portions surround a central axis of the bulb-type semiconductor light-emitting device lamp and are separated from each other.

19. The bulb-type semiconductor light-emitting device lamp of claim 18, wherein the first installation surface faces the second installation surface.

* * * * *